US007595824B2

(12) United States Patent
Egawa et al.

(10) Patent No.: US 7,595,824 B2
(45) Date of Patent: Sep. 29, 2009

(54) SIGNAL PROCESSOR, DATA PROCESSOR, AND SOLID STATE IMAGE SENSOR

(75) Inventors: Yoshitaka Egawa, Kanagawa-ken (JP); Yasushi Nishimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 538 days.

(21) Appl. No.: 11/190,118

(22) Filed: Jul. 27, 2005

(65) Prior Publication Data

US 2006/0022862 A1  Feb. 2, 2006

(30) Foreign Application Priority Data

Jul. 28, 2004 (JP) ............... 2004-220462

(51) Int. Cl.
  *H04N 5/217* (2006.01)
  *H04N 5/228* (2006.01)
  *H03M 1/12* (2006.01)

(52) U.S. Cl. ............ 348/241; 348/222.1; 341/155

(58) Field of Classification Search ......... 348/193, 348/241, 470, 533, 618, 312, 324, 222.1, 348/308, 294, 297, 295, 303, 304; 250/208.1; 341/155

See application file for complete search history.

(56) References Cited

U.S. PATENT DOCUMENTS

| 5,926,219 | A * | 7/1999 | Shimizu et al. | 348/362 |
|---|---|---|---|---|
| 6,538,695 | B1 * | 3/2003 | Xiao et al. | 348/245 |
| 6,593,966 | B1 * | 7/2003 | Watanabe | 348/312 |
| 6,801,255 | B2 * | 10/2004 | Inui | 348/241 |
| 6,822,211 | B2 * | 11/2004 | Hagihara | 250/208.1 |
| 6,903,670 | B1 * | 6/2005 | Lee et al. | 341/118 |
| 7,113,212 | B2 * | 9/2006 | Yonemoto et al. | 348/302 |
| 7,138,617 | B2 * | 11/2006 | Mabuchi | 250/208.1 |
| 7,286,170 | B2 * | 10/2007 | Inui et al. | 348/241 |
| 7,324,146 | B2 * | 1/2008 | Kanai | 348/304 |
| 7,339,151 | B2 * | 3/2008 | Mabuchi | 250/208.1 |
| 2002/0154347 | A1 * | 10/2002 | Funakoshi et al. | 358/513 |
| 2002/0158974 | A1 * | 10/2002 | Udo et al. | 348/241 |
| 2003/0169356 | A1 * | 9/2003 | Suemoto | 348/294 |
| 2004/0239781 | A1 * | 12/2004 | Harada et al. | 348/241 |
| 2005/0195304 | A1 * | 9/2005 | Nitta et al. | 348/308 |

FOREIGN PATENT DOCUMENTS

| JP | 4-2285 | 1/1992 |
|---|---|---|
| JP | 4-3666 | 1/1992 |

(Continued)

*Primary Examiner*—Tuan V Ho
*Assistant Examiner*—Marly Camargo
(74) *Attorney, Agent, or Firm*—Oblon, Spivak, McClelland, Maier & Neustadt, L.L.P.

(57) ABSTRACT

Random pollution of output signals with logic noise caused by video signal processing is prevented and a high quality image video signal with reduced random noise is output. A signal processor includes a digital signal processor (DSP) which processes a digital signal resulting from analog to digital conversion of an analog signal stored in a pixel unit, an output circuit which outputs a signal resulting from signal processing by the DSP, and line memory which is disposed between the output circuit and the DSP and stores a digital signal output from the DSP for a shorter period than the horizontal scanning period. The output circuit reads the signal stored in the line memory in sync with the beginning of a read-out timing in the horizontal scanning period.

20 Claims, 14 Drawing Sheets

FOREIGN PATENT DOCUMENTS

| | | |
|---|---|---|
| JP | 04-167774 | 6/1992 |
| JP | 06-217205 | 8/1994 |
| JP | 7-250266 | 9/1995 |
| JP | 11-41522 | 2/1999 |
| JP | 11-146227 | 5/1999 |
| JP | 2001-36857 | 2/2001 |
| JP | 2001-78132 | 3/2001 |
| JP | 2002-10121 | 1/2002 |
| JP | 2002-281235 | 9/2002 |
| JP | 2003-101881 | 4/2003 |
| JP | 2003-153070 | 5/2003 |
| JP | 2003-179814 | 6/2003 |

\* cited by examiner

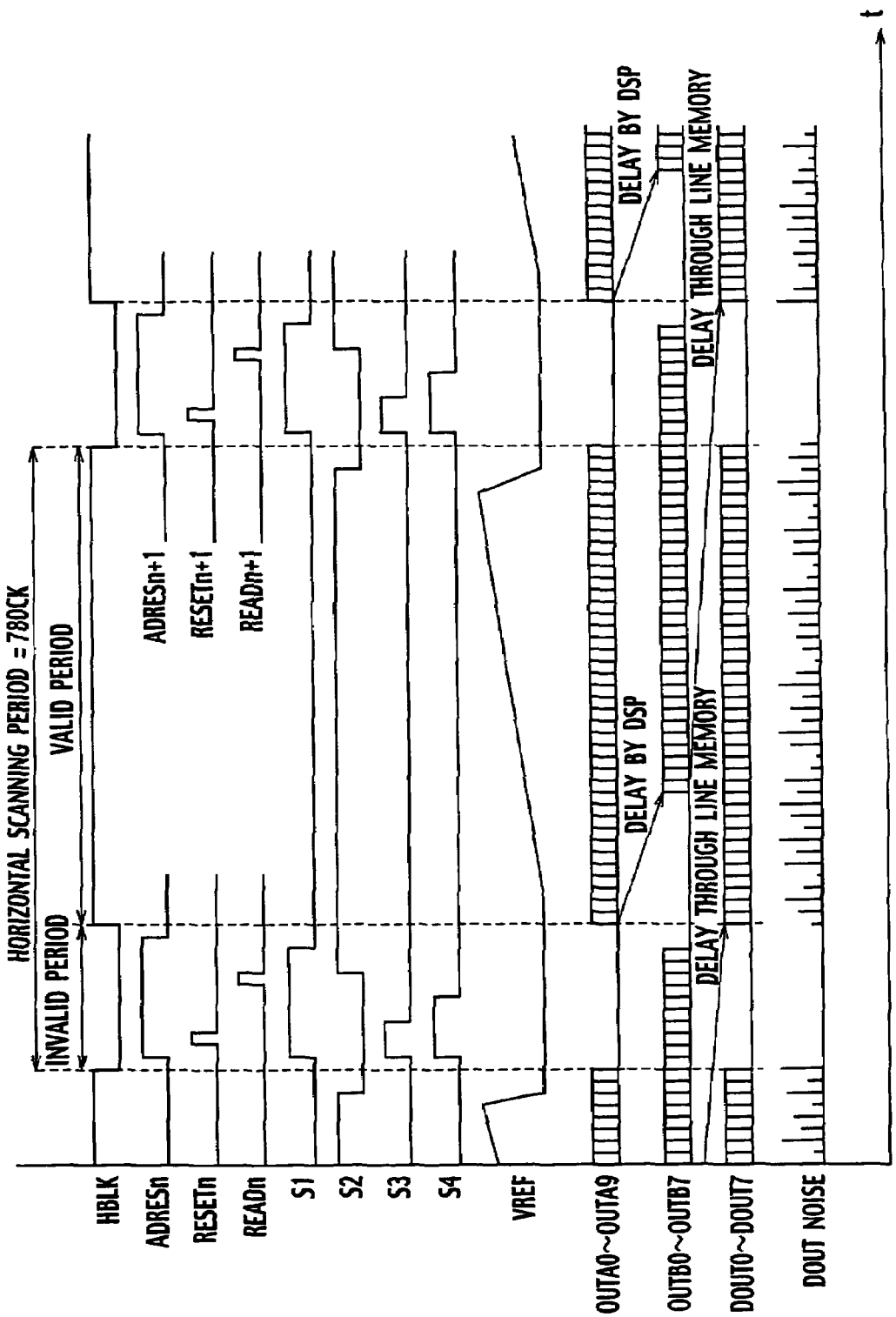

SIGNAL PROCESSOR, DATA PROCESSOR, AND SOLID STATE IMAGE SENSOR

CROSS REFERENCE TO RELATED APPLICATIONS AND INCORPORATION BY REFERENCE

This application is based upon and claims the benefit of priority from prior Japanese Patent Application P2004-220462 filed on Jul. 28, 2004; the entire contents of which are incorporated by reference herein.

BACKGROUND OF THE INVENTION

1. Field of the Invention

The present invention relates to a signal processor used for a solid-state image sensor such as a CMOS image sensor module, a data processor, and a solid-state image sensor. The signal processor is used for cellular phones with image sensors, digital cameras, and video cameras, for example.

2. Description of the Related Art

When a video signal processor for a conventional CMOS image sensor is performing analog to digital conversion or digital to analog conversion, output signals are polluted by periodic logic noise caused by a color synchronization signal and a synchronization signal issued in a horizontal blanking period. The periodic logic noise results in generation of pattern noise. The analog to digital conversion and digital to analog conversion are performed within a horizontal valid period by delaying a video signal through line memory. This prevents pollution by periodic logic noise caused by a color synchronization signal and a synchronization signal issued in a horizontal blanking period during analog to digital conversion or digital to analog conversion, so as to decrease in pattern noise (see Japanese Patent Application Laid-Open No. Hei 07-250266, for example).

However, according to the video signal processing device disclosed in Japanese Patent Application Laid-Open No. Hei 07-250266, output noise imposed on a digital video output signal at an output terminal pollutes an output signal when canceling noise in a horizontal blanking period, resulting in generation of lined random noise. Moreover, logic noise caused by digital video signal processing in a horizontal valid period may pollute signals during analog to digital conversion, and generate random noise.

SUMMARY OF THE INVENTION

An aspect of the present invention inheres in a signal processor which includes: a timing generation circuit configured to generate a noise canceling period within a horizontal scanning period so that a noise canceling circuit can cancel noise imposed on an analog signal stored in a pixel unit; an analog to digital conversion circuit configured to carry out analog to digital conversion of a signal resulting from noise cancellation; a digital signal processor configured to process a digital signal resulting from analog to digital conversion; an output circuit configured to output a signal resulting from signal processing by the digital signal processor; a line memory configured to store a digital signal for a shorter period than the horizontal scanning period and disposed before the output circuit; and a control circuit configured to control the line memory so as to cause the output circuit to output the signal stored in the line memory during a period other than the noise canceling period in the horizontal scanning period.

Another aspect of the present invention inheres in a data processor which includes: a sensor core comprising a pixel unit configured to receive an image, a noise canceling circuit disposed adjacent to the pixel unit, and an analog to digital conversion circuit disposed adjacent to the noise canceling circuit; a sensor-driving timing generation circuit configured to control the operation of the sensor core; a reference voltage generation circuit configured to generate a reference waveform for comparison by the analog to digital conversion circuit; a digital signal processor configured to process a signal read out from the analog to digital conversion circuit; a system synchronization generator configured to be connected to the digital signal processor; an output circuit configured to output a signal resulting from signal processing by the digital signal processor; a phase control circuit configured to be connected to the sensor-driving timing generation circuit, the reference voltage generation circuit, the system synchronization generator, and the digital signal processor, and relatively delay an operating timing for the reference voltage generation circuit, a driving pulse for the sensor core, and operating timing for the digital signal processor; a line memory configured to store a digital signal for a shorter period than the horizontal scanning period and disposed before the output circuit; and a control circuit configured to control the line memory so as to cause the output circuit to output the signal stored in the line memory during a period other than the noise canceling period in the horizontal scanning period.

Another aspect of the present invention inheres in a solid state image sensor which includes: a pixel unit configured to receive an image; a noise canceling circuit configured to be disposed adjacent to the pixel unit and cancel noise imposed on an analog signal stored in the pixel unit; a sensor-driving timing generation circuit configured to control the operation of the pixel unit and the noise canceling circuit so that a noise canceling period for the noise canceling circuit to cancel noise can fall within the horizontal scanning period; an analog to digital conversion circuit configured to be disposed adjacent to the noise canceling circuit and analog to digital convert a signal resulting from noise cancellation; a digital signal processor configured to process a digital signal resulting from analog to digital conversion; an output circuit configured to output a signal resulting from signal processing by the digital signal processor; a line memory configured to store a digital signal for a shorter period than the horizontal scanning period and disposed before the output circuit; and a control circuit configured to control the line memory so as to cause the output circuit to output the signal stored in the line memory during a period other than the noise canceling period in the horizontal scanning period.

BRIEF DESCRIPTION OF DRAWINGS

FIG. 2 is a timing chart showing an operation of the data processor, according to the first embodiment of the present invention, in a horizontal scanning period;

DETAILED DESCRIPTION OF THE INVENTION

Figure 1A:
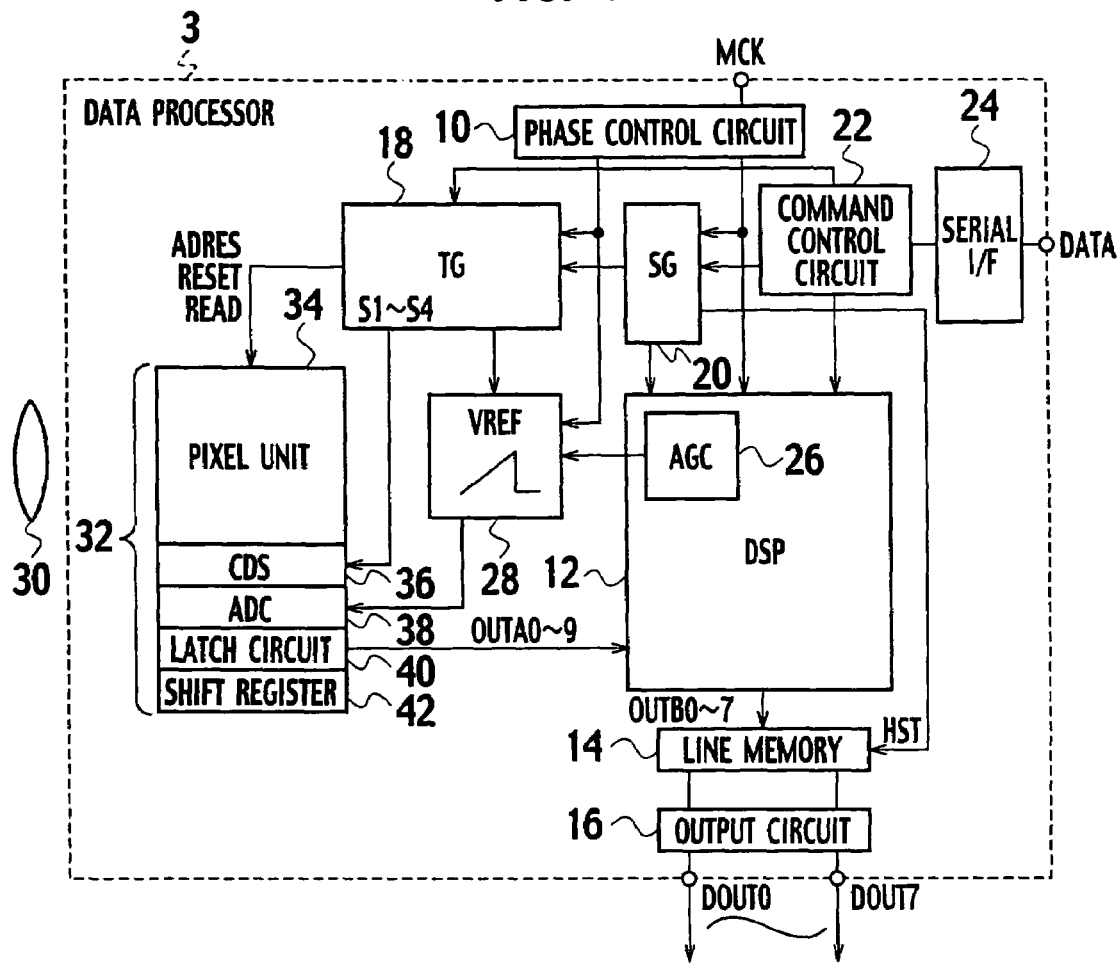
FIG. 1A is a schematic block diagram of a data processor according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Next, a first to a sixth embodiment of the present invention are described while referencing drawings. The same or similar reference numerals are attached to the same or similar parts in the following drawing description. Note that those drawings are merely schematics and thus relationship between thickness of respective parts and two-dimensional size thereof and ratio of respective parts in thickness may be inconsistent with reality according to the present invention. It is also noted that the relationship between a waveform and time axis in each timing chart and ratio of waveforms in each timing chart are different from reality, according to the present invention. Moreover, it is natural that there are parts differing in relationship and ratio of dimensions among the drawings.

The first through the sixth embodiment as described below exemplify apparatus or systems, which embody technical ideas according to the present invention. Therefore, the technical ideas according to the present invention do not limit shapes, structures, arrangements or the like of parts to those described below. The technical ideas according to the present invention may be modified into a variety of modifications within the scope of the claimed invention.

Figure 7:
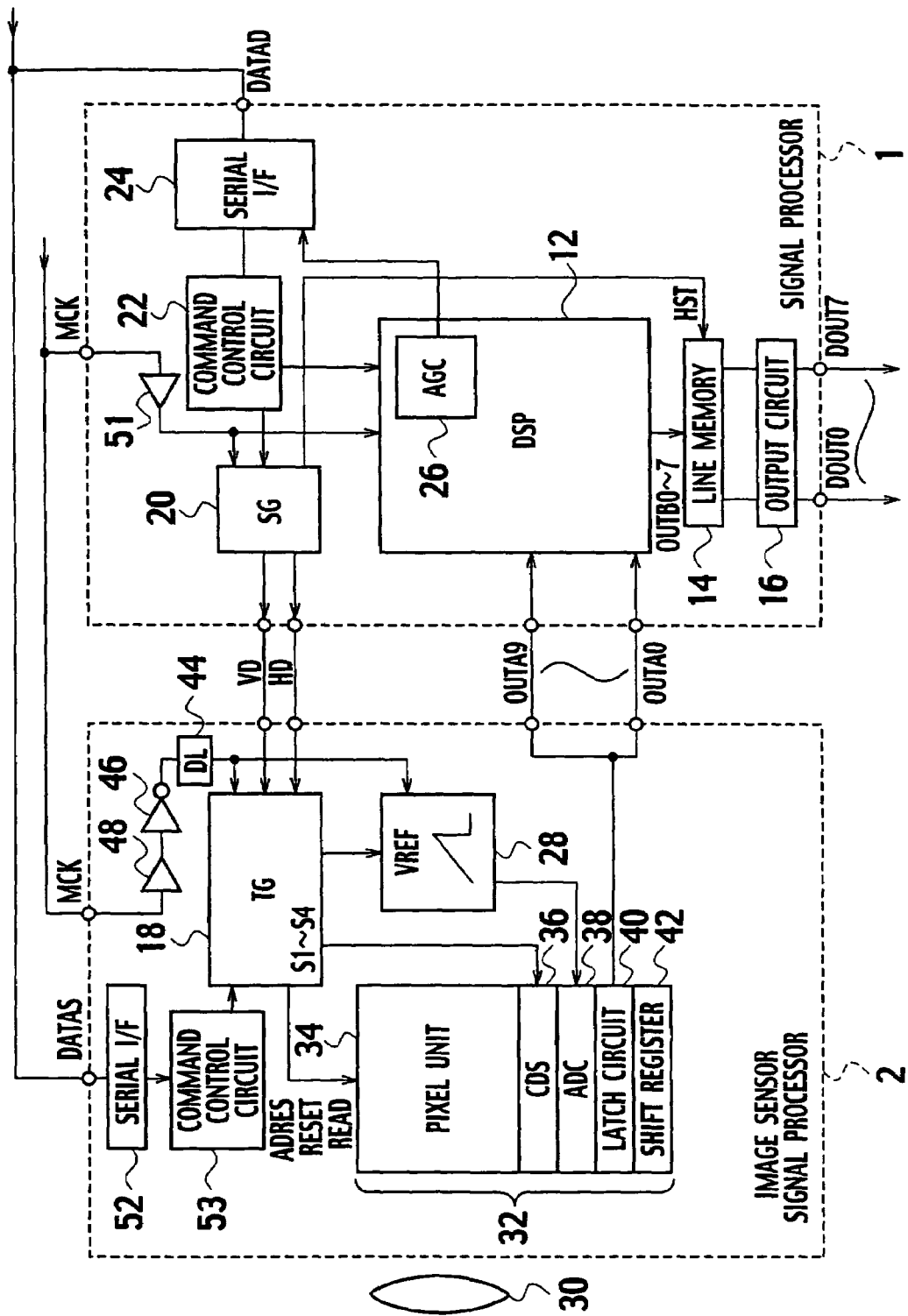
FIG. 7 is a schematic block diagram of a signal processor according to a fourth embodiment of the present invention.

A 'data processor' according to an embodiment of the present invention is described based on the first through the third and the fifth and sixth embodiments. A 'signal processor' according to an embodiment of the present invention conducts signal processing for a 'solid state image sensor' at a low noise level, as shown in FIG. 7. The 'solid state image sensor' plus one chip or two chips constitute a 'data processor'. The 'solid state image sensor' may be constituted by an active CMOS image sensor, for example. However, it is not limited to the CMOS image sensor. Alternatively, it may be a MOS image sensor, or it may have a structure having photoelectric conversion elements such as photodiodes arranged in matrix.

According to a signal processor and a data processor of the present invention, since logic noise and output noise generated through video signal processing do not pollute signals randomly, high quality video signals with reduced random noise may be provided.

STUDY EXAMPLE

Figure 12:
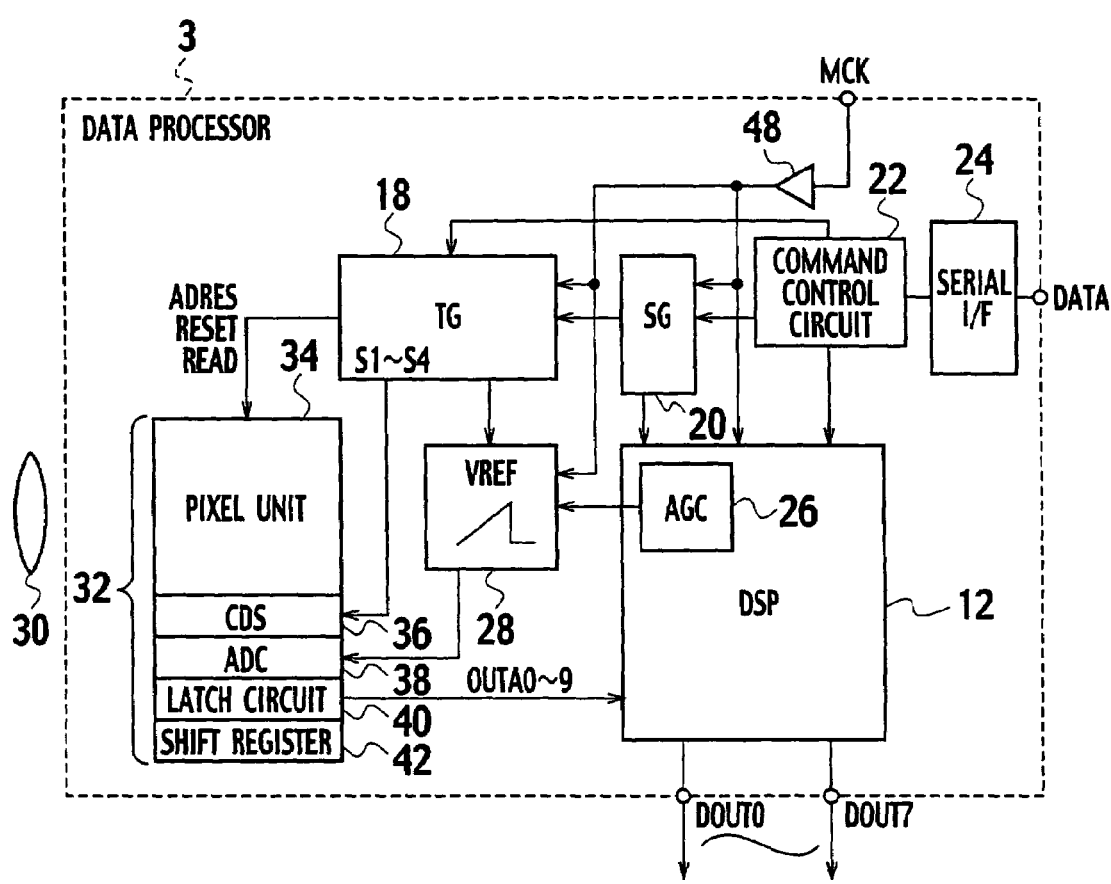
FIG. 12 is a schematic block diagram of a data processor according to a study example.
Figure 13:
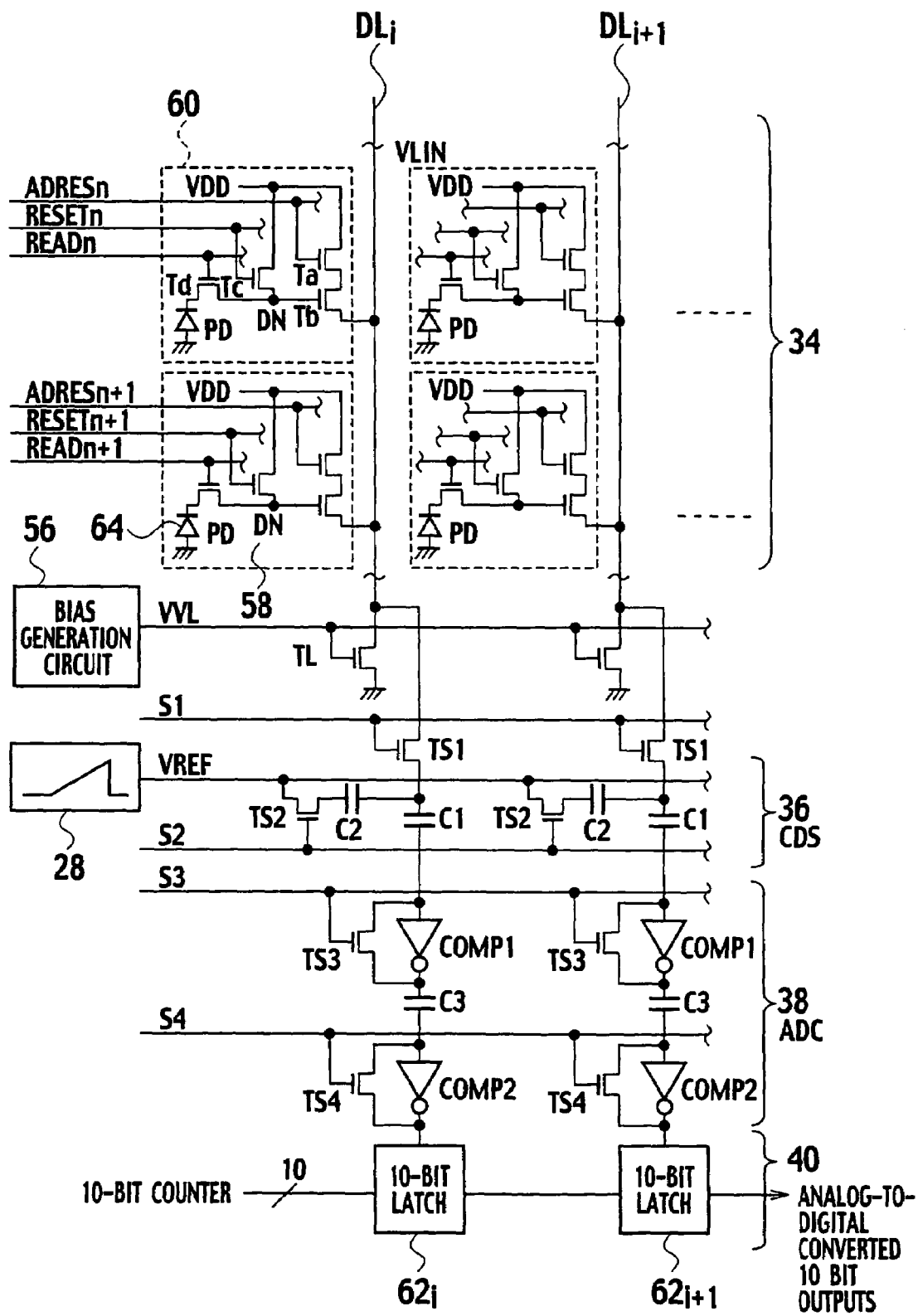
FIG. 13 is a schematic block diagram of a sensor core of the data processor, according to the study example.
Figure 14:
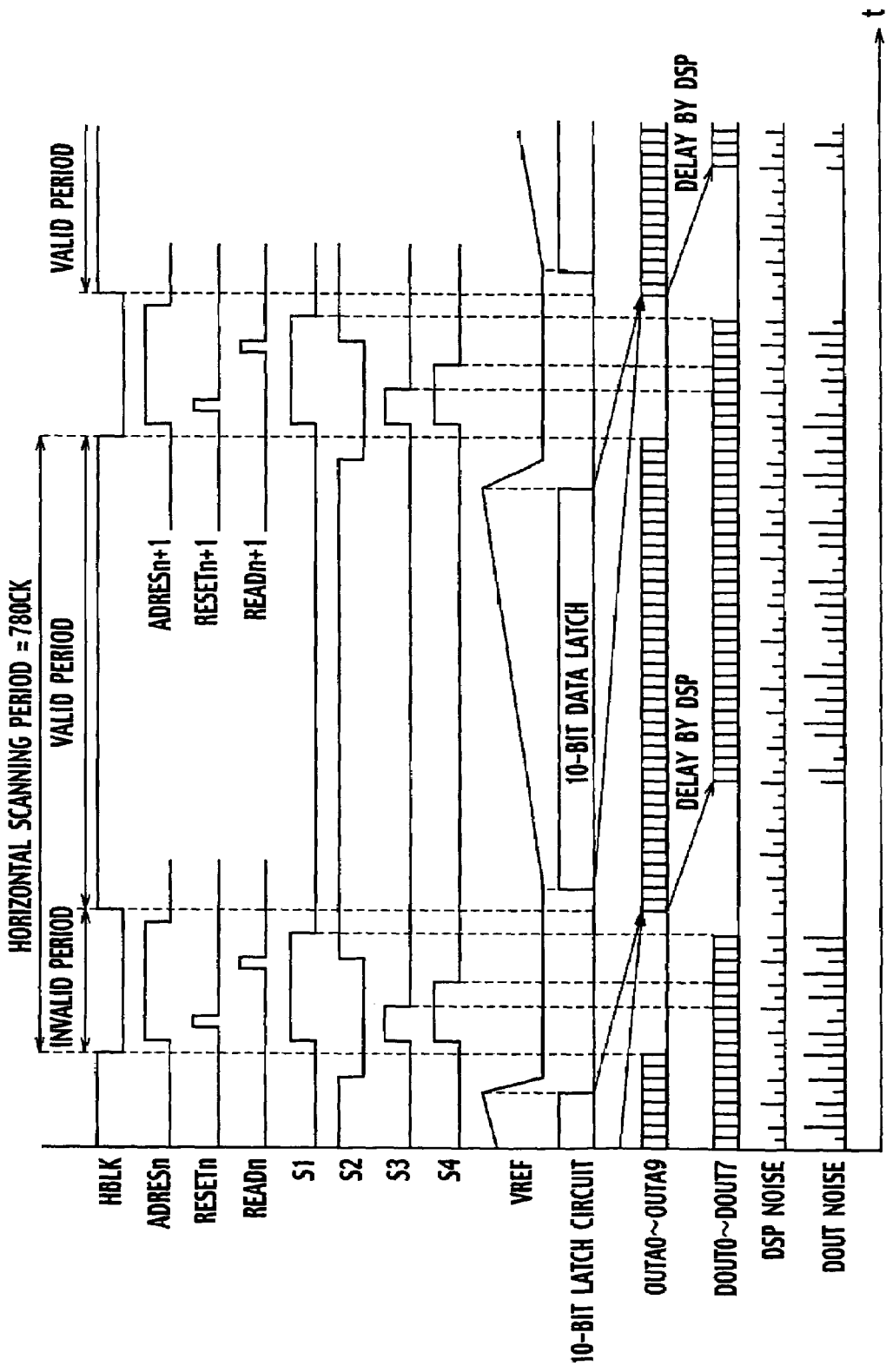
FIG. 14 is a timing chart showing an operation of the data processor, according to the study example.

A data processor 3 according to a study example is explained using FIGS. 12 through 14 before explaining a signal processor and a data processor according to an embodiment of the present invention.

As shown in FIG. 12, the structure of the data processor 3 according to the study example comprises a pixel unit 34, which receives an image collected by a lens 30, a column-based noise canceling circuit (CDS) 36 disposed under the pixel unit 34, a column-based AD converter (ADC) 38, a latch circuit 40, which latches a converted digital signal, and a horizontal shift register 42, which reads out a latched signal. The signal read out from the latch circuit 40 through an operation of the horizontal shift register 42 is output to the data processor 3 via a digital signal processor (DSP) 12. Signals read out from the pixel unit 34 and a control pulse for the CDS 36 are provided as, for example, a vertical line-selecting pulse (ADRES), a detecting unit-resetting pulse (RESET), and a signal read-out pulse (READ) from a sensor-driving timing generator (TG) 18. A reference waveform for comparison by the ADC 38 is generated by a reference voltage generator (VREF) 28. The amplitude of a waveform output from the VREF 28 is controlled by an automatic gain controller (AGC) 26 in the DSP 12.

To control the DSP 12 and operate the data processor 3, data (DATA) is provided from an external source to a system synchronization generator (SG) 20 via a serial interface circuit (I/F) 24 for a variety of controls. A command control circuit 22 controls the SG 20, the TG 18, the DSP 12 and related circuits. The entire operation of the data processor 3 is synchronized with the rising edges of a master clock signal MCK. The DSP 12 conducts processing such as white balancing, gamma correction, color separating, and edge enhancement, outputting resulting YUV eight-bit digital signals; where Y denotes an intensity signal, U denotes an (R-Y) color-difference signal (Cr), and V denotes a (B-Y) color-difference signal (Cb).

An exemplary circuit between the pixel unit 34 and the latch circuit 40 is constituted by an active CMOS image sensor as shown in FIG. 13. A single pixel 60 of the pixel unit 34 comprises four transistors (Ta, Tb, Tc, and Td) and photodiodes (PDs) 64. The pixel element 60 is two-dimensionally arranged. Transistors TL, as loads for source follower circuits, are horizontally arranged under the pixel unit 34. The gates of the respective transistors TL are commonly connected to a bias generator 56.

The CDS 36 comprises capacitors C1 and C2 a transistor TS1, which transfers signals on vertical signal lines VLIN represented by data lines DLi, DLi$_{+1}$ ..., and a transistor TS2, which applies a VREF voltage used for analog to digital conversion.

The ADC 38 comprises two-stage comparators COMP1 and COMP2 and switching transistors TS3 and TS4. The outputs from analog to digital conversion are latched by a latch circuit 40 and then read out one after another by the operation of the shift register 42. As a result, 10-bit data OUTA0 to OUTA9 is output (see FIGS. 12 and 14.)

FIG. 14 is a timing chart showing an operation of the data processor 3 according to the study example. To read out vertical n-line signals, a vertical line-selecting pulse ADRESn is activated during a horizontal invalid period (HBLK). The activation of the pulse ADRESn operates the source follower circuit, comprising an amplifying transistor TB and a load transistor TL. To remove invalid signals, such as dark current occurring at a detector (DN) 58 before the photodiode (PD) 64 reads out signal charges that are due to carrying out photoelectric conversion during a predetermined period, a reset pulse RESETn for the detector is activated during a horizontal invalid period (HBLK), so as to set a reference voltage (reset level) for the detector. The reference voltage (reset level) is output to the vertical signal line VLIN. At this time, switches S1, S3, and S4 are turned on, setting analog to digital conversion levels for the COMP1 and the COMP2 of the ADC 38, and the capacitor C1 is charged up to a reset level of the vertical signal line VIN at the same time. The capacitor C1 is charged up to the reset level at the moment the switch S3 turns off.

Afterwards, the READn is turned on and the read-out transistor Td is accordingly turned on, resulting in the signal charge accumulated in the PD 64 read out. At this time, the voltage of the signal plus the reset level is read out to the vertical signal line VLIN. At this time, turning the switch S1 on, turning the switches S3 and S4 off, and turning the switch S2 on causes the capacitor C2 to be charged up to the voltage of the vertical signal line VLIN plus the reset level, to which the capacitor C2 is then charged at the moment the switch S1 is turned off. At this time, since the input level of the COMP1 is kept at a high impedance level, the capacitor C1 retains the reset level.

Afterwards, increasing the reference voltage VREF allows the comparators COMP1 and COMP2 to conduct analog to digital conversion using the capacitors C1 and C2. Increasing the reference voltage VREF forms a rising slope from a low level to a high level in a triangular waveform. The triangular waveform is sliced into 10-bit analog to digital conversion levels of 0 to 1023, and each analog to digital conversion level is then identified using a 10-bit counter. The polarity of the reset level retained in the capacitor C1 is reverse to that of the reset level retained in the capacitor C2. Thus, the reset level is cancelled, and substantially only the signal component in the capacitor C2 is subjected to analog to digital conversion. This operation of canceling the resent level is referred to as noise cancellation (CDS). The term 'CDS' means 'correlated double sampling'.

Analog to digital converted data is retained in the latch circuit 40 shown in FIGS. 12 and 13. The analog to digital converted data is output as 10-bit data OUTA0 to OUTA9 from the latch circuit 40 during the next horizontal valid period as shown in FIGS. 12 and 14. The output 10-bit data signals OUTA0 through OUTA9 are received by the DSP 12, which then performs digital signal processing. The resulting signals from the DSP 12 are then output as parallel outputs of YUV 8-bit data DOUT0 through DOUT7 from the data processor 3.

At this time, the 8-bit data DOUT0 through DOUT7 includes delay caused by the DSP 12 signal processing. Therefore, noise (referred to as 'DOUT noise') is generated at the digital output of 8-bit data DOUT0 through DOUT7 at a time when the data changes. Logic noise caused by the DSP 12 signal processing is generated as 'DSP noise' The DOUT noise and the DSP noise cause levels of the power supply line and the GND line to change during a rising phase of the switch S3 when the reset level, which is an analog signal, is captured or during a falling phase of the switch S1 when the reset level plus the signal level is captured, resulting in noise pollution. In addition, the DOUT noise and the DSP noise pollute the analog VREF waveform. The DOUT noise and the DSP noise change due to video signals, resulting in random noise. Since the data processor 3 particularly has larger output drivers capable of driving external larger loads, the noise level of the DOUT noise tends to be higher. According to the study examples shown in FIGS. 12 through 14, the outputs of drivers having 4 mA driving capability are polluted by random noise, which is double the DSP noise generated by the DSP 12 and a large amount of DOUT noise. Random noise due to the DSP noise emanating from video signals pollutes the data processor 3 including the DSP 12.

According to the study examples shown in FIGS. 12 through 14, the horizontal invalid period (HBLK) is defined as a period for reading out a signal from the pixel unit 34. Alternatively, it may be defined as a period in which there is no DOUT signal in the data processor 3, and the horizontal valid period may be a DOUT signal outputting period.

FIRST EMBODIMENT

As shown in FIG. 1A, a data processor according to a first embodiment of the present invention comprises a sensor core 32, a TG 18, which controls the operation of the sensor core 32, a VREF 28, which generates a reference waveform for comparison by an ADC 38, a DSP 12, which receives a signal read out from a latch circuit 40, an SG 20 connected to the DSP 12, an output circuit 16, which outputs a signal resulting from signal processing conducted by the DSP 12, line memory 14, which is disposed between the output circuit 16 and the DSP 12 and stores signals output from the DSP 12 for a shorter period than the horizontal scanning period, and a phase control circuit 10 connected to the TG 18, the VREF 28, the SG 20, and the DSP 12 and relatively delays the operating phases of the sensor core 32 and the DSP 12. The sensor core 32 comprises a pixel unit 34, which receives video signals, a CDS 36 disposed adjacent to the pixel unit 34, the ADC 38 being disposed adjacent to the CDS 36, the latch circuit 40, which latches a digital signal converted by the ADC 38, and a shift register 42, which reads out a latched signal. The output circuit 16 reads out a signal stored in the line memory 14 at the beginning of a read-out timing within the horizontal valid period. Description of the same parts as those of the study example is omitted.

Figure 1B:
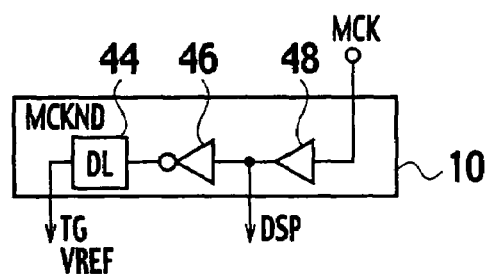
FIG. 1B shows an exemplary structure of a phase control circuit.
Figure 1C:
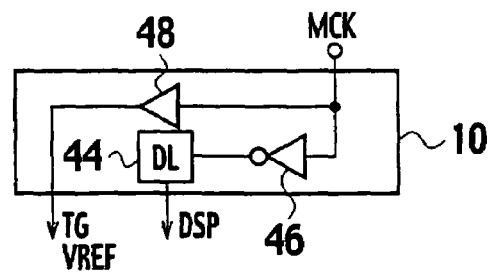
FIG. 1C shows an exemplary structure of a phase control circuit.

In FIG. 1A, the phase control circuit 10 comprises a buffer 48, an inverter 46, and a delay circuit (DL) 44, as shown in FIGS. 1B and 1C. According to the example in FIG. 1B, signals which will enter the TG 18 or the VREF 28 are delayed relative to signals entering the DSP 12. On the other hand, according to the example in FIG. 1C, signals which will enter the DSP 12 are delayed relative to signals entering the TG 18 or the VREF 28.

What is different from the data processor according to the study example in FIG. 12 is that the outputs OUTPUTB0 through OUTPUTB7 of the DSP 12 are output as DOUT0 through DOUT7 from the data processor 3 via the line memory 14 and the output circuit 16.

In addition, in the data processor 3 in which the phase control circuit 10 shown in FIG. 1B is used, signal processing is conducted by the DSP 12 in sync with the rising edges of the MCK buffered by the buffer 48. However, the driving TG 18 and the VREF 28 in the sensor core 32 operate in sync with the rising edges of a master clock signal MCKND, which results from buffering the MCK by the buffer 48, inverting the MCK by the inverter 46, and then delaying the inverted MCK by the DL 44. The amount of delay provided by the DL 44 is set not to exceed the rising edge of the MCK.

On the other hand, in the data processor 3 in which the phase control circuit 10 shown in FIG. 1C is used, the driving TG 18 and the VREF 28 in the sensor core 32 operates in sync with the rising edges of the buffered MCK provided from the buffer 48. However, signal processing is conducted by the DSP 12 in sync with the rising edges of the master clock signal MCKND, which results from inverting the MCK by the inverter 46 and then delaying the inverted MCK by the DL 44. The delayed amount provided by the DL 44 being set not to exceed the rising edge of the MCK is the same. Driving pulses for the latch circuit 40 and the shift register 42 are supplied from the SG 20 so as to avoid logic noise pollution.

FIG. 2 shows a timing chart of an operation of the data processor according to the first embodiment of the present invention during a horizontal scanning period. Since the basic operation thereof is the same as that of the study example shown in FIG. 14, description of the same parts is omitted.

Referencing FIG. 2, an operation of the line memory 14 shown in FIG. 1 is described. The DSP outputs OUTB0 to OUTB7 are stored in the line memory 14. As shown in FIG. 2, the line memory 14 stores the DSP outputs for mere a short period corresponding to the delayed period generated by the DSP 12 from the horizontal scanning period. The DSP outputs OUTB0 to OUTB7 stored in the line memory 14 are delayed by a short period corresponding to the delayed period generated by the DSP 12, and then output as DOUT0 through DOUT7 from the data processor 3 via the output circuit 16 during a horizontal valid period. As shown in FIG. 2, this operation prevents DOUT noise from occurring during invalid periods. As a result, DOUT noise pollution generated at rising edges of the S3, which captures the reset level, and at falling edges of the S1, which captures the reset level plus a signal, can be avoided. The DOUT noise has been described as a problem in the study example of FIG. 14. Normal operation is conducted with a single horizontal scanning period of 780 clock cycles, a single horizontal valid period of 640 clock cycles, and an invalid period of 140 clock cycles; where a single pixel period equals a single clock cycle.

Figure 3:
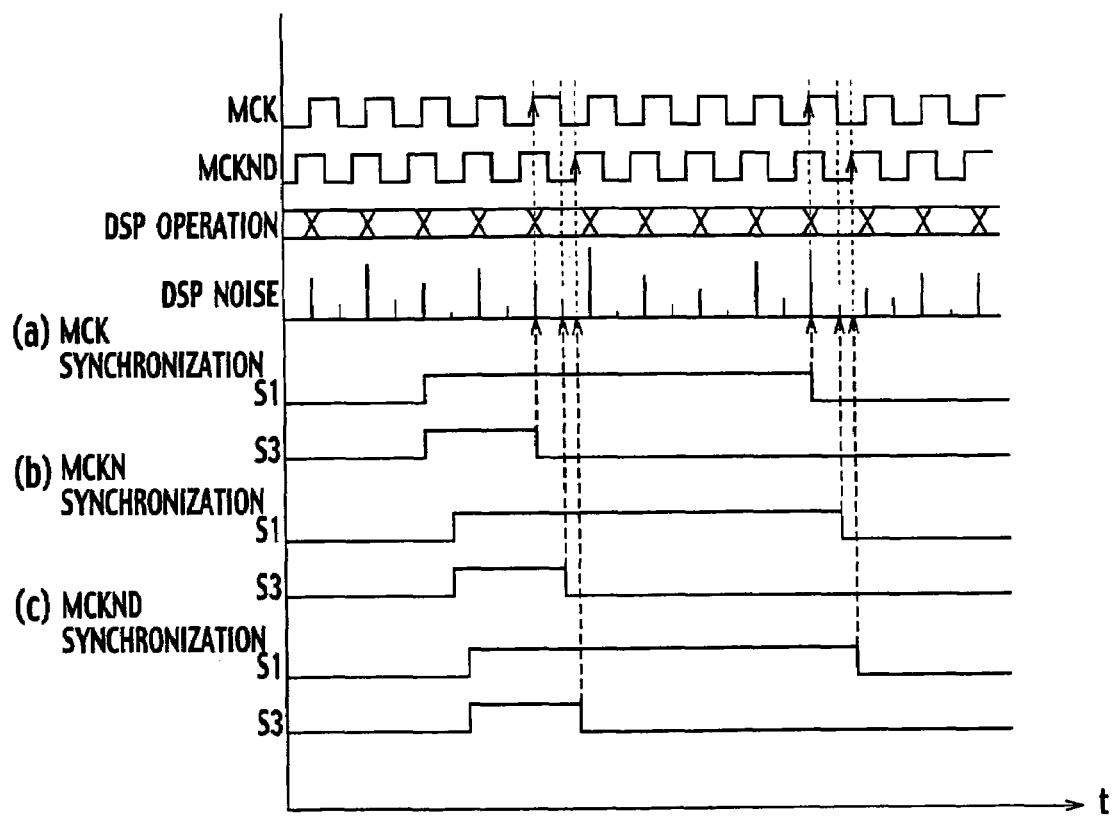
FIG. 3 is a timing chart showing an operation of the data processor, according to the first embodiment of the present invention, in a horizontal invalid period.

FIG. 3 is a timing chart showing an operation of the data processor according to the first embodiment of the present invention during a horizontal scanning period.

In the case of using a three hundred and thirty thousand-pixel CMOS image sensor as an example, valid pixels comprise 660 horizontal pixels by 494 vertical pixels. Of these pixels, 640 horizontal pixels by 480 vertical pixels are actual recording pixels. On the other hand, 525 vertical lines by 780 horizontal clock cycles are used for a drive system. The 780 clock cycles for the horizontal scanning period does not allow analog to 10-bit digital conversion. This is because 1024 clock cycles are required. Accordingly, the operation needs 1560 clock (MCK) cycles, which is twice the 780 clock cycles. Thus, the MCK during a 30 Hz operation is 1/(1/30)/525 lines/1560 clock cycles or 24.57 MHz. Therefore, in the case of the 30 Hz operation, the MCKs are 24 MHz pulses.

FIG. 3 corresponds to a timing chart during a horizontal invalid period for the data processor 3 in which the phase control circuit 10 in FIG. 1B is used. The operation of the DSP is in sync with the rising edges of the MCK. Therefore, logic noise generated by the DSP 12 has a high level in sync with the rising edges of the MCK, as indicated in 'DSP NOISE' in FIG. 3. This noise level changes according to image information. In addition, since the logic circuit in the DSP 12 also operates in sync with the falling edges of the MCK, some logic noise may be generated as indicated in 'DSP NOISE' in FIG. 3.

When the operating pulses of the switches S1 and S3 generated in the TG 18 are in sync with the rising edges of the MCK, DSP noise pollutes at the moment the switches S1 and S3 are turned off, thereby increasing random noise. FIG. 3B shows that logic noise generated at the falling edges of the MCK pollutes in sync with the MCKN (in sync with the falling edges of the MCK.)

On the other hand, DSP noise is not generated in sync with the MCKND corresponding to the first embodiment of the present invention, as shown in FIG. 3C. Similarly, pollution of the VREF 28 by DSP noise can be avoided by synchronizing with the MCKND. Parallel processing by the DSP 12 decreases the processing speed to half, thereby increasing effectiveness of MCKND synchronization.

The DSP 12 is constituted by CMOS circuits, for example. The nMOS or pMOS transistors of CMOS drivers drive load capacitances (gates plus line capacities). The nMOS or pMOS transistors constitute a circuit of resistors and capacitors. Change in logic allows the power supply to charge capacitors via resistors when an output changes from 0 to 1. The change in the electric current is due to an RC time constant determined by a resistance and a capacitance. Conversely, when the output changes from 1 to 0, since the load capacitances have saturated, an electric current flowing from the load side to the ground line (GND) changes due to the RC time constant determined by the resistance and the capacitance. This change in electric current causes a change in voltage due to the resistance of the ground line (GND), resulting in generation of noise. Accordingly, since noise generated in the CMOS logic decreases due to a time constant, decrease in the DSP operating speed reduces in DSP noise.

According to the data processor 3 of the first embodiment of the present invention, use of the line memory 14 substantially shortens a DSP 12 signal processing delay time.

Moreover, according to the data processor 3 of the first embodiment of the present invention, control of the starting position of the output signals DOUT0 through DOUT7 from the data processor 3 prevents generation of DSP 12 logic noise (DSP noise) and output noise (DOUT noise) at the output terminals of the data processor 3 during a pixel signal read-out period (particularly a CDS operating period).

Therefore, DSP noise and output noise pollution of signals during noise cancellation such as correlated double sampling (CDS) can be prevented, and high quality video signals with reduced random noise is possible.

Moreover, making a DSP 12 operating phase relatively differ from a sensor core 32 operating pulse phase, where both phases are of inverted pulses of the master clock signal MCK, and by providing different delaying for the DSP operating phase and the sensor core operating phase by the delay element DL 44 in the phase control circuit 10, decreases DSP noise pollution of output signals.

Similarly, making the phase of the output pulses from the data processor 3 relatively different from a sensor operating pulse phase decreases output noise pollution of output signals.

SECOND EMBODIMENT

Figure 4:
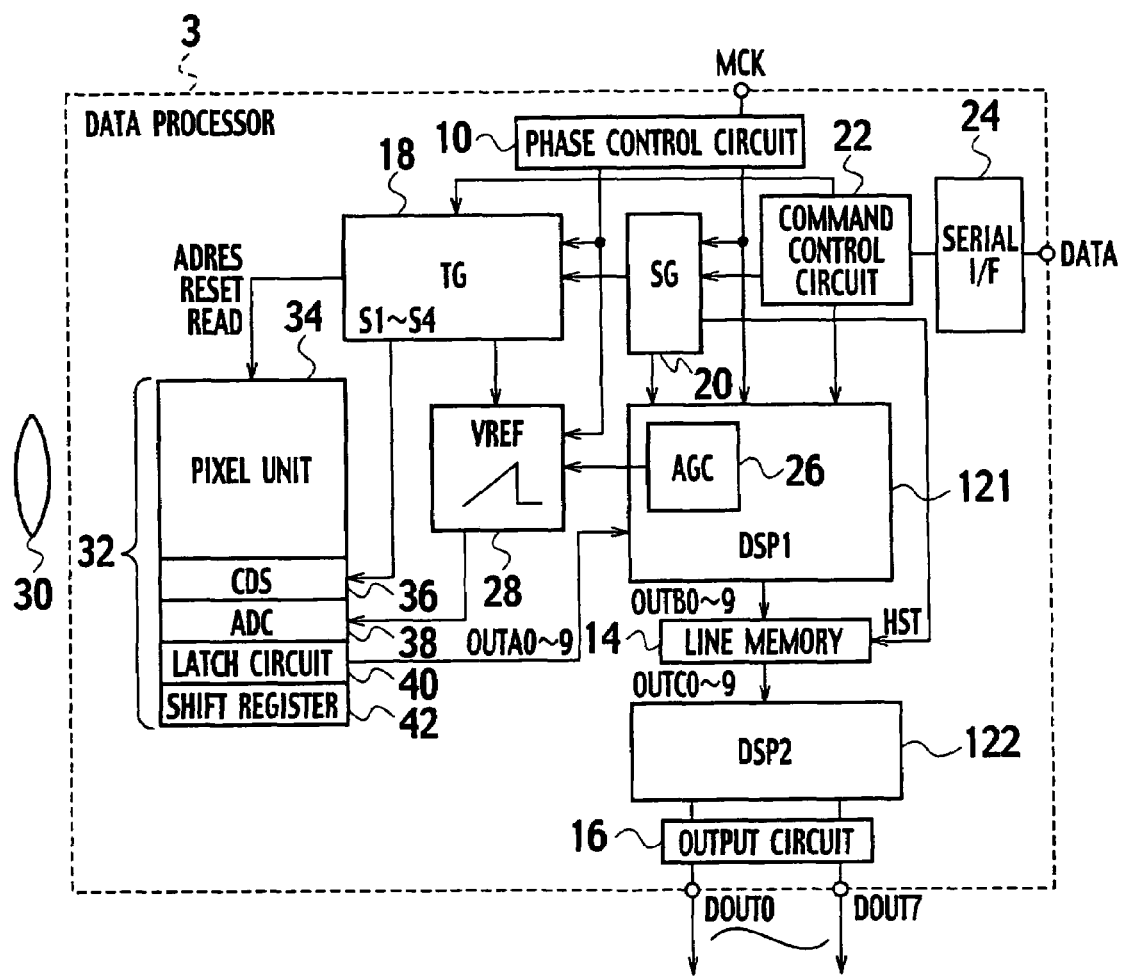
FIG. 4 is a schematic block diagram of a data processor according to a second embodiment of the present invention.

FIG. 4 shows a structure of a data processor according to a second embodiment. Description of the same parts as those in the study example and the first embodiment is omitted. What is different from the data processor according to the first embodiment shown in FIG. 1 is that the DSP is divided into DSP1 and DSP2 and the line memory 14 is disposed between DSP121 and DSP122. Dividing the DSP into two parts shortens the total delay time of the DSP121 and DSP122.

Figure 5:
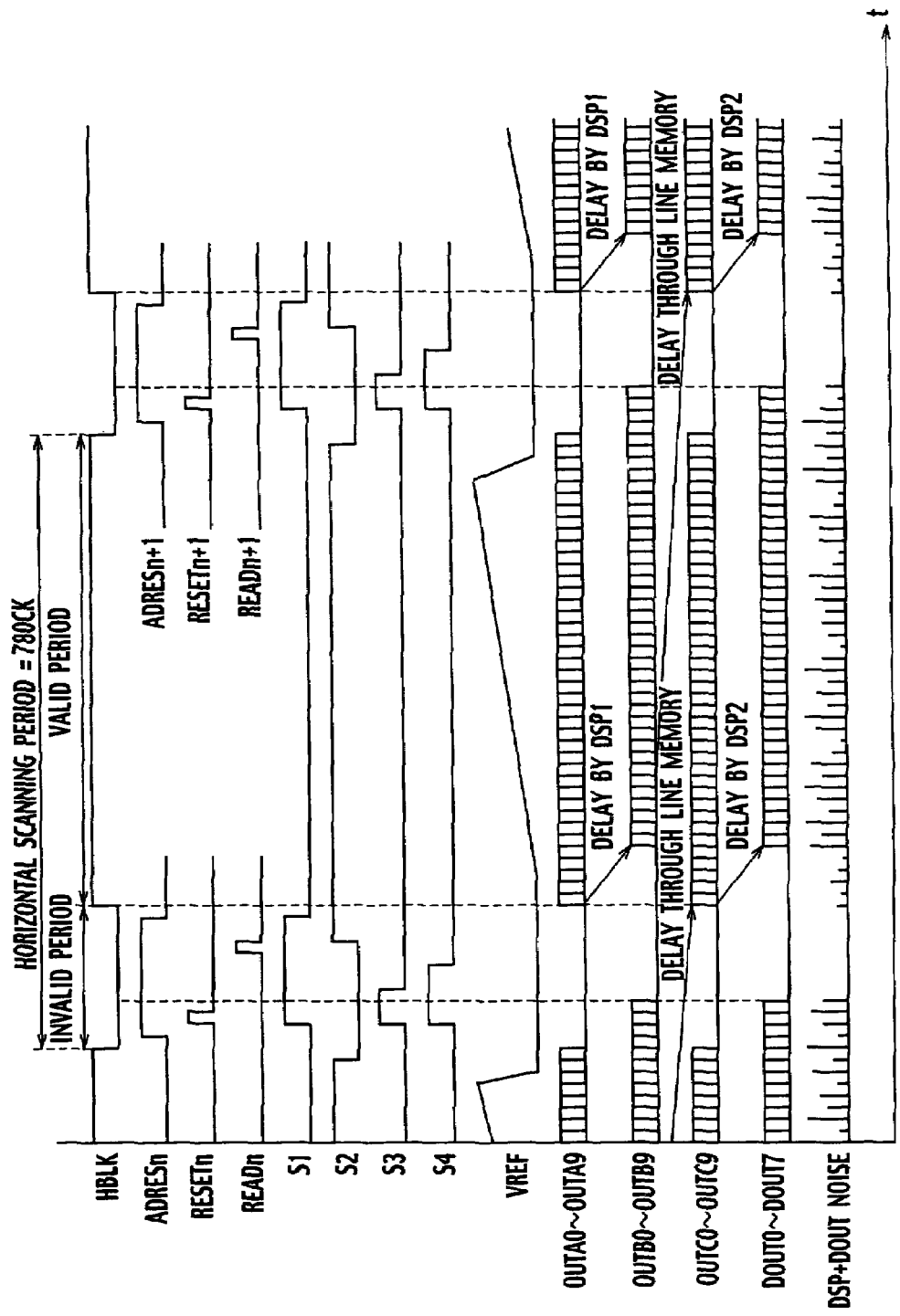
FIG. 5 is a timing chart showing an operation of the data processor, according to the second embodiment of the present invention, in a horizontal scanning period.

FIG. 5 shows a timing chart of an operation of the data processor according to the second embodiment during a horizontal scanning period. Since the basic operation is the same as that of the study example shown in FIG. 14 and the first embodiment shown in FIG. 2, description of the same parts is omitted.

Referencing FIG. 5, an operation of the line memory 14 shown in FIG. 4 is described. The outputs OUTB0 through OUTB9 from the DSP 1 are 10-bit parallel outputs delayed by the DSP 121. The amount of delay is set so that previous data can terminate before the falling edge of an operating pulse of the switch S3. The outputs OUTB0 through OUTB9 from the DSP1 are stored in the line memory 14. As shown in FIG. 5, the line memory 14 stores the outputs for merely a short period corresponding to the delayed period generated by the DSP 121 from the horizontal scanning period. Afterwards, the line memory 14 outputs 10-bit data outputs OUTC0 through OUTC9. The 10-bit data outputs OUTC0 through OUTC9 are received by the DSP 122. The output signals of the DSP 2 resulting from being delayed by the DSP 122 are received by the output circuit 16. YUV 8-bit data DOUT0 through DOUT7 is then output from the data processor 3 via the output circuit 16. The YUV 8-bit data DOUT0 through DOUT7 is parallel data.

According to the data processor of the second embodiment, the operations of the DSPs 121 and 122 and the line memory 14 prevent DSP noise and DOUT noise from occurring during the period from the falling edge of the operating pulse of the switch S3 to the falling edge of the operating pulse of the switch S1, as shown in FIG. 5. This process may be prevented by addition of a line memory 14 if there is a long delay time of the DSP 121 or the DSP 122.

According to the data processor 3 of the second embodiment, use of the line memory 14 substantially shortens a DSP 121 signal processing delay time.

Moreover, according to the data processor 3 of the second embodiment, control of the starting position of the output signals DOUT0 through DOUT7 from the data processor 3 prevents logic noise generation by DSPs 121 and 122 (DSP noise) and output noise (DOUT noise) at the output terminals of the data processor 3 during a pixel signal read-out period.

Therefore, DSP noise and output noise pollution of signals during noise cancellation (period from a falling edge of the switch S3 to a rising edge of the switch S1) such as correlated double sampling (CDS) can be prevented, and high quality video signals with reduced random noise is possible.

Furthermore, making operating phases of the DSPs 121 and 122 relatively different from the sensor core 32 operating pulse phase, where both phases are inverted pulses of the master clock signal MCK, and by differently delaying such operating phases by the delay element DL 44 in the phase control circuit 10, decreases DSP noise pollution of output signals.

Similarly, making the phase of the output pulses from the data processor 3 relatively different from the sensor operating pulse phase decreases output noise pollution of output signals.

THIRD EMBODIMENT

Figure 6:
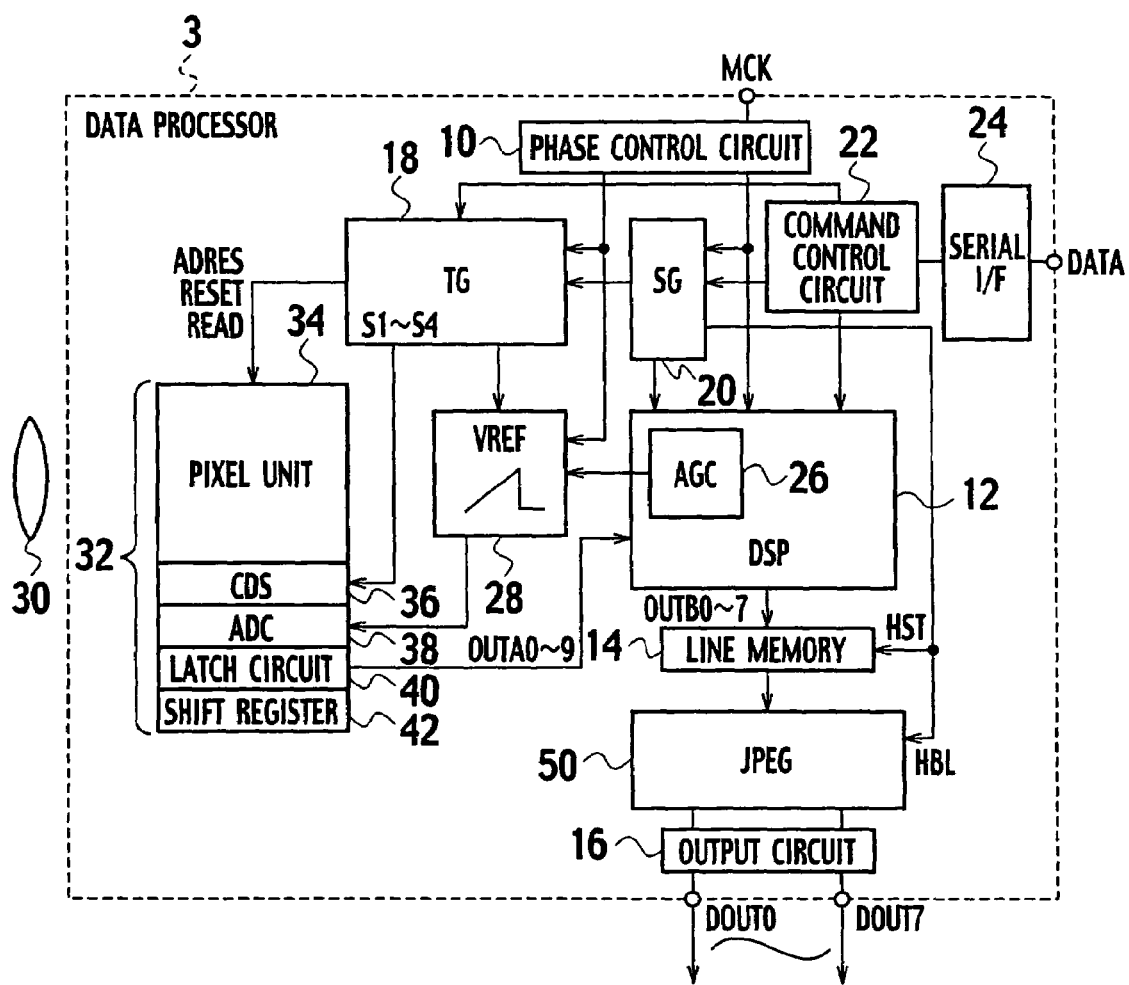
FIG. 6 is a schematic block diagram of a data processor according to a third embodiment of the present invention.

FIG. 6 shows a structure of a data processor according to a third embodiment of the present invention. Description of the same parts as those in the study example and the first and the second embodiment is omitted. What is different from the data processor according to the second embodiment shown in FIG. 4 is that a JPEG circuit 50 is disposed instead of the divided DSP 122 and the line memory 14 is disposed between the DSP 12 and the JPEG circuit 50. As a result, total delay time by the DSP 121 and the JPEG circuit 50 is decreased.

The data processor 3 according to the third embodiment is structured as a semiconductor LSI circuit mixed with a JPEG circuit. The data processor 3 according to the third embodiment is capable of operating in the same manner as the first and the second embodiment by controlling the starting position of the output signals DOUT0 through DOUT7 from the data processor 3 using the line memory 14 as with the data processor according to the first and the second embodiment. Needless to say a plurality of line memories 14 may be used.

The data processor 3 according to the third embodiment allows the DSP 12 to have a substantially shortened signal processing delay time using the line memory 14.

Moreover, according to the data processor 3 of the third embodiment, control of the starting position of the output signals DOUT0 through DOUT7 from the data processor 3 prevents generation of logic noise (DSP) from the JPEG circuit 50 and output noise at output terminals of the data processor 3 during a pixel signal read-out period.

Therefore, DSP noise and output noise pollution of signals during noise cancellation, such as correlated double sampling (CDS), can be prevented, and high quality video signals with reduced random noise is possible.

Moreover, making a DSP 12 operating phase relatively different from the sensor core 32 operating pulse phase, where both phases are inverted pulses of the master clock signal MCK, and by differently delaying such phases by the delay element DL 44 in the phase control circuit 10 decreases DSP noise pollution of output signals.

Similarly, making the phase of the output pulses from the data processor 3 relatively different from the sensor operating pulse phase decreases output noise pollution of output signals

FOURTH EMBODIMENT

A signal processor 1 according to a fourth embodiment of the present invention performs signal processing with low noise for an image sensor signal processing unit 2 including a sensor core 32, as shown in FIG. 7. A two-chip structure with the image sensor signal processing unit 2 allows substantially the same data processor as that of the first through the third embodiment. Description of the same parts as those in the study example and the first through the third embodiment is omitted.

The signal processor 1 according to the fourth embodiment of the present invention comprises the DSP 12, which performs digital signal processing of a signal resulting from analog to digital conversion of an analog signal stored in the pixel unit 34, the output circuit 16, which outputs a signal resulting from signal processing by the DSP 12, the line memory 14 disposed between the output circuit 16 and the DSP 12 and storing signals output from the DSP 12 for a shorter period than the horizontal scanning period, as shown in FIG. 7. The output circuit 16 reads out a signal stored in the line memory 14 in sync with the beginning of a read-out timing in the horizontal valid period.

What is different from the data processor according to the first embodiment shown in FIG. 1 is that the image sensor signal processor 2 including the sensor core 32 is independently structured from the signal processor 1 including the DSP 12. Alternatively, the image sensor signal processor 2 and the signal processor 1 may naturally be configured on one chip, thereby providing the same data processor as the data processor 3 according to the first through the third embodiment.

In the image sensor signal processor 2, a serial interface circuit 52 and a command control circuit 53 are disposed differently from that of the signal processor 1, and data (DATAS) is received by the processor 2 via the serial interface circuit 52 from an external source. Data (DATAD) is received by the signal processor 1 via the serial interface circuit 24 from an external source, which is the same as FIG. 1.

In FIG. 7, a phase control circuit comprising the buffer 48, the inverter 46, and the DL 44 delays a signal that is received by the TG 18 or the VREF 28, relative to a signal that is received by the DSP 12 via the buffer 51. Conversely, needless to say, a signal that is received by the DSP 12 may be delayed relative to a signal that is received by the TG 18 or the VREF 28.

Moreover, as shown in FIG. 7, control signals VD and HD is received by the TG 18 from the SG20 while 10-bit output data OUTA0 through OUTA9 from the latch circuit 40 is received by the DSP 12.

The output signals OUTB0 through OUTB7 from the DSP 12 are delayed via the line memory 14 as with FIG. 1 and then output as output signals DOUT0 through DOUT7 from the signal processor 1. Signal processing by the DSP 12 is performed in sync with the rising edges of the MCK. On the other hand, the image sensor signal processor 2 including the sensor core 32 operates in sync with the rising edges of a MCKND clock signal, which results from receiving the MCK clock signal and then delaying the MCK clock signal by the buffer 48, the inverter 46, and the DL 44. The amount of delay by the DL 44 is determined not to exceed the rising edges of the MCK. In other words, the semiconductor LSI circuit comprising the signal processor 1 operates in sync with the rising edges of the MCK. On the other hand, the semiconductor LSI circuit comprising the image sensor signal processor 2 operates in sync with the rising edges of the MCKND. The phase of the YUV outputs DOUT0 through DOUT7 from the DSP 12 is adjusted so that they can be output during a horizontal valid period for the image sensor signal processor 2 including the sensor core 32, as with FIG. 2.

Since the signal processor 1 according to the fourth embodiment is capable of low noise signal processing for the image sensor signal processor 2 including the sensor core 32 and is independently structured from the image sensor signal processor 2, it can be easily provided as a semiconductor LSI circuit structure. The same data processor as the data processor 3 according to the first through the third embodiment may be constituted by two chips including the image sensor signal processor 2 with high design flexibility.

The signal processor 1 according to the fourth embodiment allows a substantially shortened DSP 12 signal processing delay time using the line memory 14.

Moreover, according to the signal processor 1 of the fourth embodiment, control of the starting position of the output signals DOUT0 through DOUT7 from the data processor 1 prevents generation of logic noise (DSP noise) from the DSP 12 and output noise at the output terminals of the data processor 1 during a pixel signal read-out period.

Therefore, DSP noise and output noise pollution of signals during noise cancellation, such as correlated double sampling (CDS), can be prevented, and high quality video signals with reduced random noise is possible.

Moreover, making the DSP 12 operating phase relatively different from the sensor core 32 operating pulse phase decreases DSP noise pollution of output signals.

Similarly, making the phase of the output pulses from the data processor 1 relatively different from the sensor operating pulse phase decreases output noise pollution of output signals.

While the phase delay circuit is provided on an input side of the image sensor signal processor, it may be alternatively disposed on an input side for output pulses ADRES, RESET, and READ from a TG circuit, an input side of the switches S1 through S4, or an input side of the VREF generation circuit, which decreases logic noise generated by the TG circuit, the latch circuit, and the shift register or related circuits in the image sensor signal processor.

FIFTH EMBODIMENT

Figure 8:
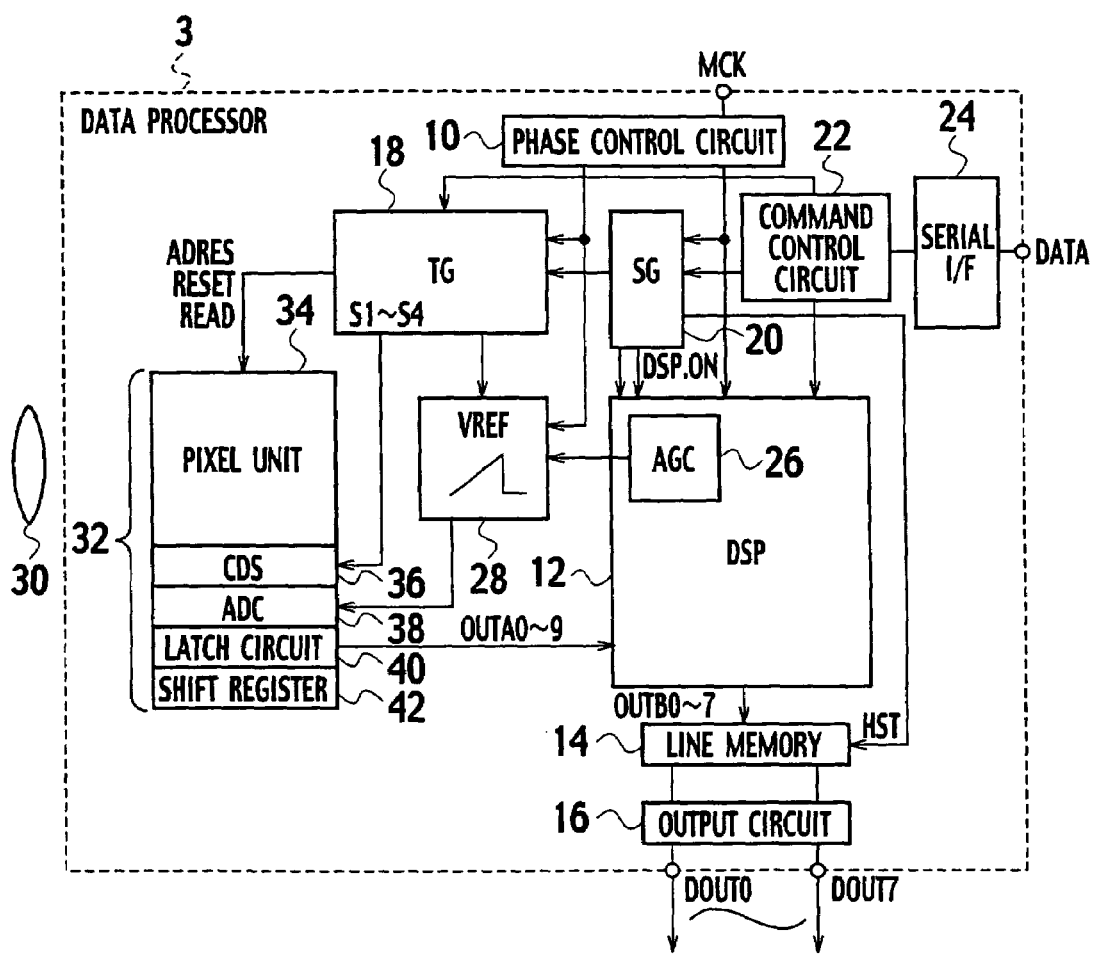
FIG. 8 is a schematic block diagram of a data processor according to a fifth embodiment of the present invention.

A data processor according to a fifth embodiment of the present invention is structured as shown in FIG. 8. Description of the same parts as those in the first embodiment in FIG. 1 is omitted. What is different from the data processor according to the first embodiment shown in FIG. 1 is that the SG 20 provides the DSP 12 with a DSP.ON signal for initiating the DSP 12 to conduct signal processing during a horizontal valid period.

Figure 9:
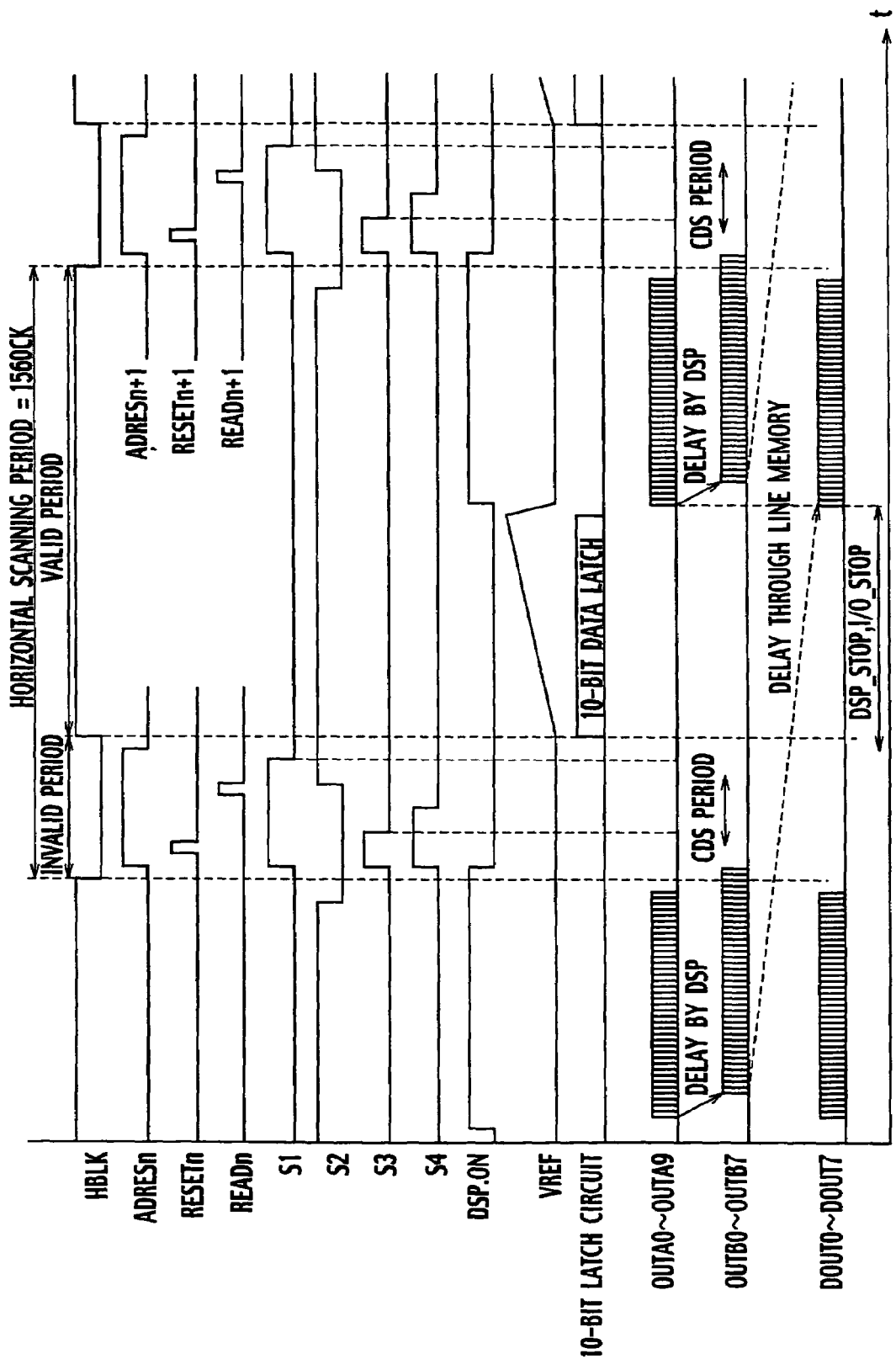
FIG. 9 is a timing chart showing operation of the data processor, according to the fifth embodiment of the present invention, in a horizontal scanning period.

FIG. 9 is a timing chart showing an operation of the data processor 3 according to the fifth embodiment of the present invention. The timing chart in FIG. 9 is for an operation of the data processor 3 in FIG. 8 at 15 Hz with the horizontal scanning period having 1560 clock signal cycles, which is twice the number of clock signal cycles in FIG. 8. The fifth embodiment normally operates with the horizontal valid period having 1280 clock signal cycles and the horizontal invalid period having 240 clock signal cycles. The operation during the horizontal invalid period is the same as with FIG. 3.

As shown in FIG. 9, the horizontal valid period is divided into two sub-periods, and analog to digital conversion is carried out during the first sub-period. More specifically, provision of a VREF triangle waveform allows the 10-bit latch circuit 40 to latch 10-bit data, as shown in FIG. 9. The analog to digital converted data is stored in the latch circuit 40. Upon reception of the DSP.ON signal from the SG 20 during the second sub-period of the horizontal valid period, the DSP 12 starts operation to cause the sensor core 32 to output digital signals OUTPUTA0 through OUTPUTA9, which are then received by the DSP 12.

The YUV signals OUTB0 through OUTB7, delayed by signal processing by the DSP 12, are output to the outside of the data processor 3 via the line memory 14 as 8-bit data DOUT0 through DOUT7 in sync with an outputting phase of the sensor core 32. The amount of delay time by the signal processing by the DSP 12 is designed for the signals to be output before the falling edge of an operating pulse of the switch S3.

Since signal processing is not yet initiated during the first sub-period of the horizontal valid period by the DSP 12, and thus, the 8-bit data DOUT0 through DOUT7 is not output, DSP noise and DOUT noise do not pollute during analog to digital conversion.

When operating the data processor 3 at 30 Hz, 48 MHz resulting from frequency-dividing the MCK into double speed should be used. At this time, the output signal DOUT also has double speed or 24 MHz.

The data processor 3 according to the fifth embodiment allows a substantially shortened DSP 12 signal processing delay time using the line memory 14.

Moreover, according to the data processor 3 of the fifth embodiment, control of the starting position of the output signals DOUT0 through DOUT7 from the data processor 3 prevents generation of logic noise (DSP noise) from the DSP 12 and output noise (DOUT noise) at output terminals of the data processor 3 during a pixel signal read-out period. Therefore, DSP noise and output noise pollution of signals during noise cancellation such as correlated double sampling (CDS) can be prevented, and high quality video signals with reduced random noise are possible.

Moreover, making the DSP 12 operating phase relatively different from the sensor core 32 operating pulse phase, where both phases are of inverted pulses of the master clock signal MCK, and by differently delaying such phases by the delay element DL 44 in the phase control circuit 10 decreases DSP noise pollution of output signals.

Similarly, making the phase of the output pulses from the data processor 3 relatively different from the sensor operating pulse phase decreases output noise pollution of output signals.

Furthermore, decreasing DSP noise pollution of output signals during analog to digital conversion is possible by operating the DSP 12 at double speed for terminating the DSP operation during half of the horizontal valid period, and then carrying out analog to digital conversion during the remaining half period.

Furthermore, outputting the output signal DOUT from the data processor 3 during a period other than the analog to digital converting period decreases output noise pollution of output signals.

SIXTH EMBODIMENT

Figure 10:
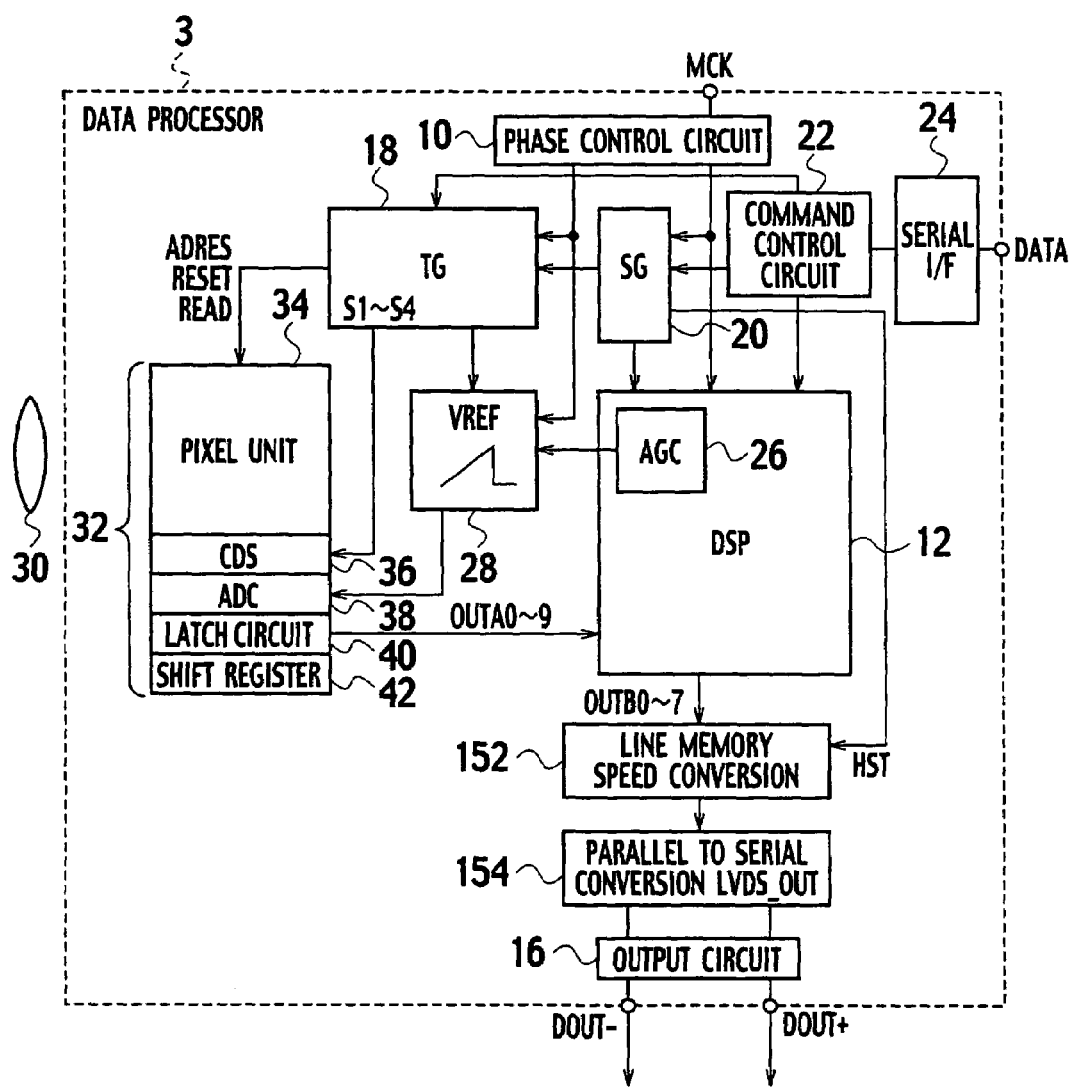
FIG. 10 is a schematic block diagram of a data processor according to a sixth embodiment of the present invention.

A data processor 3 according to a sixth embodiment of the present invention is structured as shown in FIG. 10. Description of the same parts as those of the study example and the data processor according to the first embodiment of the present invention is omitted.

What is different from the data processor 3 according to the first embodiment shown in FIG. 1 is that the outputs OUTB0 through OUTB7 of the DSP enter a line memory speed changing circuit 152. The line memory speed changing circuit 152 converts the speed of input signals to half speed signals, which are then received by a parallel-to-serial conversion circuit 154. The parallel-to-serial conversion circuit 154 converts received 8-bit parallel data to 8× speed serial data.

The data converted by the parallel-to-serial conversion circuit 154 is shown as a low voltage differential signal LVDS_OUT in FIG. 10. The low voltage differential signal LVDS_OUT is received by a differential output circuit 16, which then outputs it as a low voltage differential output (DOUT+/DOUT−) to the outside of the data processor 3. The differential output circuit 16 is characterized in that it cannot be influenced by changes in supplied power and does not generate output noise because it is constituted by constant-current operational amplifiers.

Figure 11:
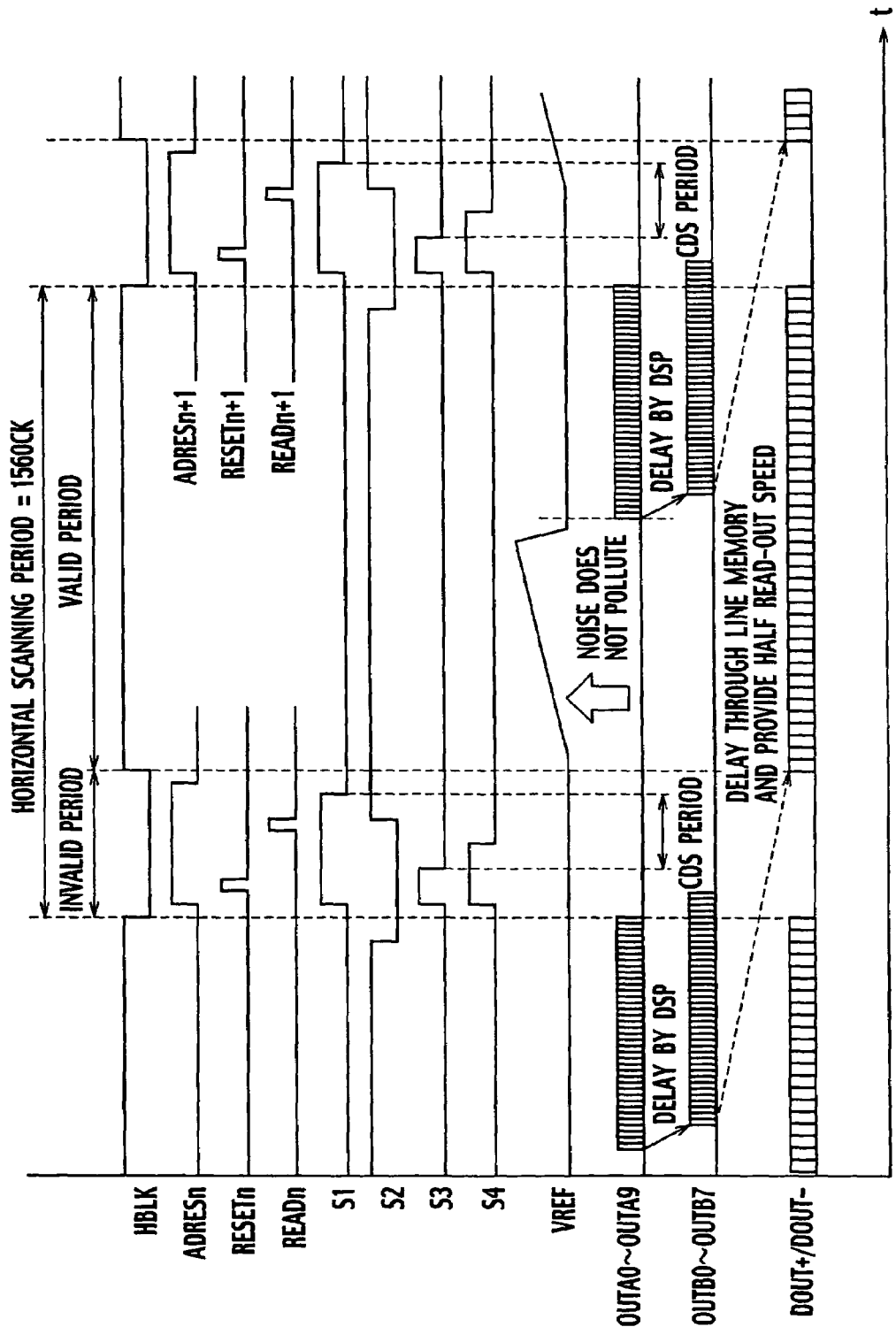
FIG. 11 is a timing chart showing an operation of the data processor, according to the sixth embodiment of the present invention, in a horizontal scanning period.

FIG. 11 is a timing chart showing an operation of the data processor according to the sixth embodiment. The outputs OUTB0 through OUTB7 of the DSP shown in FIG. 10 are output during half of the horizontal valid period. In other words, the outputs OUTB0 through OUTB7 of the DSP are frequency-divided into half speed and then output during the horizontal valid period. The frequency of the output signals is the same as that of the first embodiment or approximately 24 MHz, even at 30 Hz operation.

The sixth embodiment carries out parallel to serial conversion at the parallel-to-serial conversion circuit 154. However, the transmission speed for parallel data may alternatively be converted and then output as parallel data. The signal outputting frequency during 30 Hz operation is 12 MHz, which is half of 24 MHz and the same operating frequency as that of the first embodiment.

This operation prevents DSP noise pollution. DOUT noise polluting output signals can be reduced by synchronizing the output signals with the rising edges of the MCK as in FIG. 3 and also synchronizing driving by both the sensor core 32 and analog to digital converting with the rising edges of the MCKND.

The total amount of power consumption does not increase because the operation halts during half of the horizontal scanning period, even though the DSP 12 signal processing frequency is double speed, increasing the power consumption during signal processing. The data processor according to the sixth embodiment requires two lines of line memory. Since writing in and reading out signals of the latter half of a single line overlap with each other, operating is conducted while alternately switching between lines for write-in and lines for read-out.

The data processor 3 according to the sixth embodiment allows a substantially shortened DSP 12 signal processing delay time using the line memory speed changing circuit 152.

Moreover, according to the data processor 3 of the sixth embodiment, control of the starting position of the output signals DOUT0 through DOUT7 from the data processor 3 prevents generation of logic noise (DSP noise) from the DSP 12 and output noise (DOUT noise) at output terminals of the data processor 3 during a pixel signal read-out period.

Therefore, DSP noise and output noise pollution of signals during noise cancellation such as correlated double sampling (CDS) can be prevented, and high quality video signals with reduced random noise are possible.

Moreover, making the DSP 12 operating phase relatively different from the sensor core 32 operating pulse phase, where both phases are of inverted pulses of the master clock signal MCK, and by differently delaying such phases by the delay element DL 44 in the phase control circuit 10 decreases DSP noise pollution of output signals.

Similarly, making the phase of the output pulses from the data processor 3 relatively different from the sensor operating pulse phase decreases output noise pollution of output signals.

Furthermore, decreasing DSP noise pollution of output signals during analog to digital conversion is possible by operating the DSP 12 at double speed for terminating the DSP operation during half of the horizontal valid period, and then carrying out analog to digital conversion during the remaining half period.

Furthermore, outputting the output signal DOUT from the data processor 3 during a period other than the analog to digital converting period decreases output noise pollution of output signals.

OTHER EMBODIMENTS

The first through the sixth embodiment having one or two lines of line memory have been described, or the embodiments may alternatively have more than two lines of line memory.

In the first through the sixth embodiment, the delay element DL 44 may be constituted by multiple aluminum lines or inverter circuits. A test on reduction in random noise shows that synchronization of the sensor operating timing with an inverted pulse MCKN has reduced random noise to half. In addition, synchronization with a MCKND resulting from delaying a quarter of the MCK cycle has further reduced random noise to half (a quarter, altogether).

Since the sensor core 32 is disposed and separated from the logic circuit (the DSP 12, the TG 18, the SG 20, and the command control circuit 22 or 53), increasing the delay time is possible by synchronizing the output to the sensor core 32 in the logic circuit with the inverted phase (MCKN) of the MCK and disposing aluminum lines to the sensor core 32. When the aluminum lines cannot provide a sufficient delay time, a capacitor C may be added, or a delay element may be added. Alternatively, the line memory 14 may be line memory used for signal processing.

While the present invention has been described according to the first through the sixth embodiment, these embodiments and drawings constituting a part of this disclosure do not limit the scope of the present invention. This disclosure shows those skilled in the present invention a variety of embodiments, alternative embodiments, and operational technologies.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A signal processor comprising:
  a timing generation circuit configured to generate a noise canceling period within a horizontal scanning period for a noise canceling circuit to cancel noise imposed on an analog signal stored in a pixel unit;
  an analog to digital conversion circuit configured to carry out analog to digital conversion of a signal resulting from noise cancellation;
  a first line memory configured to store a digital signal resulting from analog to digital conversion;
  a digital signal processor configured to process the digital signal stored in the first line memory;
  an output circuit configured to output a signal resulting from signal processing by the digital signal processor;
  a second line memory configured to store a digital signal for a shorter period than the horizontal scanning period and be disposed before the output circuit; and
  a control circuit configured to control the second line memory so as to cause the output circuit to output the signal stored in the second line memory during a period other than the noise canceling period in the horizontal scanning period.

2. The signal processor of claim 1, wherein the analog to digital conversion is performed during half of the horizontal scanning period, the digital signal processing is performed during the remaining half period, and a period not overlapping with the period for the analog to digital conversion and the digital signal processing is prepared.

3. The signal processor of claim 1, wherein a read-out frequency for the second line memory is not more than half of a write-in frequency.

4. The signal processor of claim 1, further comprising a circuit configured to be disposed before the output circuit and convert a parallel signal to a serial signal.

5. A data processor comprising:
  a sensor core comprising a pixel unit configured to receive an image, a noise canceling circuit disposed adjacent to the pixel unit, and an analog to digital conversion circuit disposed adjacent to the noise canceling circuit;
  a sensor-driving timing generation circuit configured to control the operation of the sensor core;
  a reference voltage generation circuit configured to generate a reference waveform for comparison by the analog to digital conversion circuit;
  a first line memory configured to store a signal read out from the analog to digital conversion circuit;
  a digital signal processor configured to process the signal stored in the first line memory;
  a system synchronization generator configured to be connected to the digital signal processor;
  an output circuit configured to output a signal resulting from signal processing by the digital signal processor;
  a phase control circuit configured to be connected to the sensor-driving timing generation circuit, the reference voltage generation circuit, the system synchronization generator, and the digital signal processor, and relatively delay an operating timing for the reference voltage generation circuit, a driving pulse for the sensor core, and operating timing for the digital signal processor;
  a second line memory configured to store a digital signal for a shorter period than the horizontal scanning period and be disposed before the output circuit; and
  a control circuit configured to control the second line memory so as to cause the output circuit to output the signal stored in the second line memory during a period other than the noise canceling period in the horizontal scanning period.

6. The data processor of claim 5, wherein the analog to digital conversion is conducted during half of the horizontal scanning period, the digital signal processing is conducted during the remaining half period, and a period not overlapping with the period for the analog to digital conversion and the digital signal processing is prepared.

7. The data processor of claim 5, wherein a read-out frequency for the second line memory is not more than half of a write-in frequency.

8. The data processor of claim 5 further comprising a circuit configured to be disposed before the output circuit and convert a parallel signal to a serial signal.

9. A solid state image sensor comprising:
  a pixel unit configured to receive an image;
  a noise canceling circuit configured to be disposed adjacent to the pixel unit and cancel noise imposed on an analog signal stored in the pixel unit;
  a sensor-driving timing generation circuit configured to control the operation of the pixel unit and the noise canceling circuit so that a noise canceling period for the noise canceling circuit to cancel noise can fall within the horizontal scanning period;
  an analog to digital conversion circuit configured to be disposed adjacent to the noise canceling circuit and analog to digital convert a signal resulting from noise cancellation;
  a first line memory configured to store a digital signal resulting from analog to digital conversion;
  a digital signal processor configured to process the digital signal stored in the first line memory;

an output circuit configured to output a signal resulting from signal processing by the digital signal processor;

a second line memory configured to store a digital signal for a shorter period than the horizontal scanning period and be disposed before the output circuit; and a control circuit configured to control the second line memory so as to cause the output circuit to output the signal stored in the second line memory during a period other than the noise canceling period in the horizontal scanning period.

10. The solid state image sensor of claim 9, wherein the analog to digital conversion is conducted during half of the horizontal scanning period, the digital signal processing is conducted during the remaining half period, and a period not overlapping with the period for the analog to digital conversion and the digital signal processing is prepared.

11. The solid state image sensor of claim 9, wherein a read-out frequency for the second line memory is not more than half of a write-in frequency.

12. The solid state image sensor of claim 9, further comprising a circuit configured to be disposed before the output circuit and convert a parallel signal to a serial signal.

13. The solid state image sensor of claim 9, wherein the noise canceling circuit cancels noise by removing a difference between a signal existing state and a signal non-existing state from the pixel unit.

14. The solid state image sensor of claim 9, wherein the analog to digital conversion circuit simultaneously converts the analog signal for a single line to a digital signal during the horizontal scanning period.

15. The solid state image sensor of claim 9 further comprising:

a reference voltage generation circuit configured to generate a reference waveform for comparison by the analog to digital conversion circuit;

a system synchronization generator configured to be connected to the digital signal processor; and a phase control circuit configured to be connected to the sensor-driving timing generation circuit, the reference voltage generation circuit, the system synchronization generator, and the digital signal processor, and relatively delay an operating timing for the reference voltage generation circuit, a driving pulse for the sensor core, and operating timing for the digital signal processor.

16. The solid state image sensor of claim 15, wherein the analog to digital conversion is conducted during half of the horizontal scanning period, the digital signal processing is conducted during the remaining half period, and a period not overlapping with the period for the analog to digital conversion and the digital signal processing is prepared.

17. The solid state image sensor of claim 15, wherein a read-out frequency for the second line memory is not more than half of a write-in frequency.

18. The solid state image sensor of claim 15 further comprising a circuit configured to be disposed before the output circuit and convert a parallel signal to a serial signal.

19. The solid state image sensor of claim 15, wherein the noise canceling circuit cancels noise by removing a difference between a signal existing state and a signal non-existing state from the pixel unit.

20. The solid state image sensor of claim 15, wherein the analog to digital conversion circuit simultaneously converts the analog signal for a single line to a digital signal during the horizontal scanning period.

* * * * *